United States Patent [19]
Krishna et al.

[11] 3,945,028
[45]*Mar. 16, 1976

[54] HIGH SPEED, HIGH POWER PLASMA THYRISTOR CIRCUIT

[75] Inventors: Surinder Krishna, Ballston Lake, N.Y.; Chang Kwei Chu, Pittsburgh, Pa.

[73] Assignee: Westinghouse Electric Corporation, Pittsburgh, Pa.

[ * ] Notice: The portion of the term of this patent subsequent to Aug. 13, 1991, has been disclaimed.

[22] Filed: Apr. 26, 1973

[21] Appl. No.: 354,580

[52] U.S. Cl. .................. 357/13; 357/57; 357/58; 357/90; 331/107 R
[51] Int. Cl.² .......................................... H01L 29/90
[58] Field of Search... 317/235 AB, 235 T, 235 AD, 317/235 C, 234 V; 331/107 G, 107 R; 357/38, 15, 13, 90, 58, 57

[56] References Cited
UNITED STATES PATENTS

| | | | |
|---|---|---|---|
| 2,980,832 | 4/1961 | Stein et al. | 317/235 |
| 2,997,604 | 8/1961 | Shockley | 307/88.5 |
| 3,320,550 | 5/1967 | Gerlach | 331/96 |
| 3,391,287 | 7/1968 | Kao et al. | 307/302 |
| 3,439,239 | 5/1969 | Herlet et al. | 317/235 |
| 3,544,855 | 12/1970 | Nannichi | 317/234 |
| 3,584,270 | 6/1971 | Philips | 317/235 |
| 3,612,914 | 10/1971 | Evans | 307/285 |
| 3,624,557 | 11/1971 | Deloach et al. | 331/101 R |
| 3,673,514 | 6/1972 | Coleman et al. | 331/107 R |
| 3,829,880 | 8/1974 | Krishna | 357/58 |

OTHER PUBLICATIONS

Proc. of the 3rd Conf. on Solid State Devices, Tokyo, 1971, Y. Terasawa, "Obs. of Plas. Spread in H-S Thyristors using new Microwave Tech.," p. 198–204.

*Primary Examiner*—Andrew J. James
*Assistant Examiner*—Joseph E. Clawson, Jr.
*Attorney, Agent, or Firm*—C. L. Menzemer

[57] ABSTRACT

A plasma thyristor circuit is provided for generating high power, ultra-short duration electrical signals. A silicon semiconductor body has first, second and third impurity regions therein with a PN junction formed at the transition between the first and second or the second and third impurity regions. The second impurity region has an impurity concentration of less than about $5 \times 10^{14}$ atoms/cm$^3$, and a width of greater than about 80 microns. The ratio of the punch-through voltage of the second impurity region to the reverse breakdown voltage of the PN junction is between 0.3 and 0.7. Power sources apply both a reverse bias voltage across the body greater than said punch-through voltage and less than said reverse breakdown voltage, and a current to the body having a density greater than the saturation current density of the second impurity region.

4 Claims, 3 Drawing Figures

HIGH SPEED, HIGH POWER PLASMA THYRISTOR CIRCUIT

BACKGROUND OF THE INVENTION

Nonlinear, solid state devices that are bistable, that is, they have a high and low impedance state, are commonly referred to as thyristors. Thyristors may be switched from one impedance state to the other by means of a control signal. Unijunction transistors and PNPN diodes are common thyristors. Thyristors are not generally useful, however, where fast switching and high power pulses are required. They are known for their relatively long turn-on times (time required to reach peak voltage) and their even longer turn-off time (time required for the base region to be depleted of stored charge).

Unijunction silicon transistors (i.e., P+NN+ and P+PN+ diodes) have been made to operate in an avalanche, "trapped plasma" mode, see "A Theory For The High Efficiency Mode of Oscillation In Avalanche Diode," by Clorfiene et al., RCA Review (September, 1969), p. 397; and U.S. Pat. No. 3,612,914. The "trapped plasma" has been obtained by providing a relatively highly doped (about $1 \times 10^{15}$ to $1 \times 10^{16}$ atoms/cm$^3$) and a narrow width (about 10 micron) base region. These devices provide highly efficient, high "Q" microwave oscillators (e.g., 700–800 M Hz), high speed switches and short duration pulse generators. However, such diodes do not have utility as high power devices.

A reverse switching rectifier has been developed for fast switching of high power, see U.S. Pat. No. 3,584,270. This device provides both short turn-on ($di/dt$) and short turn-off times. But even this specific thyristor is not sufficiently fast for uncompromising use in applications such as power sources for radar modulations, power sources for injection laser diodes, power sources for electro-optical switching and applications for laser triggering, where rapid, high power turn-on and turn-off times are required. For such applications, no solid state control device was heretofore available with fully satisfactory electrical characteristics. Instead, gas switch tubes such as thyratron tubes are generally used in such applications.

The present invention overcomes the difficulties and disadvantages of prior devices and provides a solid state device capable of ultrafast, high power switching and pulse generation.

SUMMARY OF THE INVENTION

A plasma thyristor is provided which can very rapidly switch high power. Very high rates of change of voltage ($dv/dt$) and current ($di/dt$) can be provided which are many orders of magnitude greater than prior solid state devices. High power, short duration electrical pulses are thereby provided.

Generally, a silicon semiconductor body is provided having a pair of opposed major surfaces and first, second and third impurity regions therein. The first and third impurity regions are of opposite conductivity-type and each adjoins one of the opposed major surfaces. Both of said regions have high impurity concentrations to provide good ohmic contact to electrical contacts at the surfaces (preferably between $1 \times 10^{18}$ to $1 \times 10^{21}$ atoms/cm$^3$). The second region is of the same conductivity-type as either the first or third regions and has an impurity concentration therethrough less than about $5 \times 10^{14}$ atoms/cm$^3$ and preferably between $1 \times 10^{13}$ and $1 \times 10^{14}$ atoms/cm$^3$.

Thus, either a P+N− or an N+P−, preferably abrupt junction is formed within the semiconductor body at the transition between either the first and second regions or the second and third regions. The width of the second region is greater than about 80 microns to provide high power operation. The width and impurity concentration of the second region are also adjusted so that the ratio of its punch-through voltage to the reverse breakdown voltage of the P+N− junction or N+P− junction (as the case may be) is between 0.3 and 0.7. It should be noted that the reverse breakdown voltage is determined by the bias voltage at which the junction would avalanche when the width of the second region is extended with the same impurity concentration therein.

Bias-power source is electrically connected to the electrical contacts at the major surfaces. A reverse bias at the P+N− or N+P− junction is thus provided above the punch-through voltage and below the reverse breakdown (or avalanche) voltage. Preferably, the bias-power source provides a reverse bias voltage as close to avalanche as possible without causing premature avalanche by spurious noise signals present in the external electrical circuit.

A control-power source is also electrically connected to the electrical contacts at the major surface to supply electrical input to the semiconductor body. Where the thyristor is used as a high power generator, the input is, preferably, of short duration, substantially square wave pulses and step signals. The voltage of the input from the control-power source need only be sufficiently large to produce a current density large enough to cause avalanche and ionization of electrons within the second impurity region. That is, the voltage input is sufficient to produce a current density ($J$) above the saturation current density ($Jc$). $Jc$ is, in turn, a function of the impurity concentration in the second region: $Jc = q\, n_d v_s$, where $q$ is electron charge constant, $n_d$ is the impurity concentration of the second region, and $v_s$ is the saturation velocity of either n or p-type carriers.

Preferably, the input provided by the control source if greater than 1.5 times the saturation current density for best performance. Current densities between 1.0 and 1.5 times the saturation current density have been found not to provide sufficiently high plasma densities for good performance characteristics.

Other details, objects and advantages of the invention will become apparent as the following description of the present preferred embodiments and the present preferred methods of practicing the same proceeds.

BRIEF DESCRIPTION OF THE DRAWINGS

In the accompanying drawings is shown present preferred embodiments of the invention and is illustrated present preferred methods of practicing the same in which.

BRIEF DESCRIPTION OF THE PREFERRED EMBODIMENTS

Figure 1:
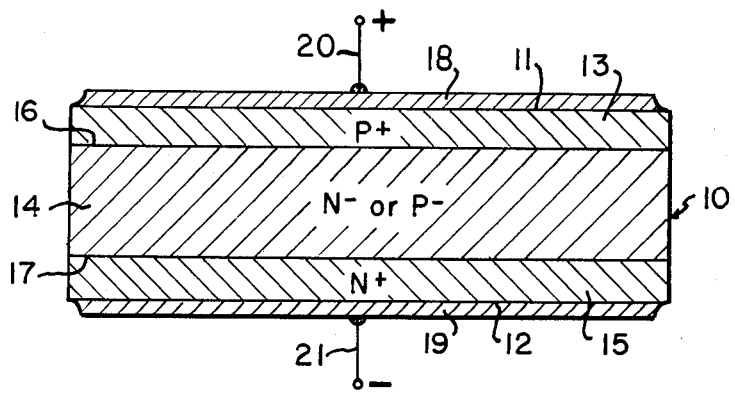
FIG. 1 is an elevational view in cross section of a silicon semiconductor body suitable for a high speed, high power silicon thyristor.
Figure 2:
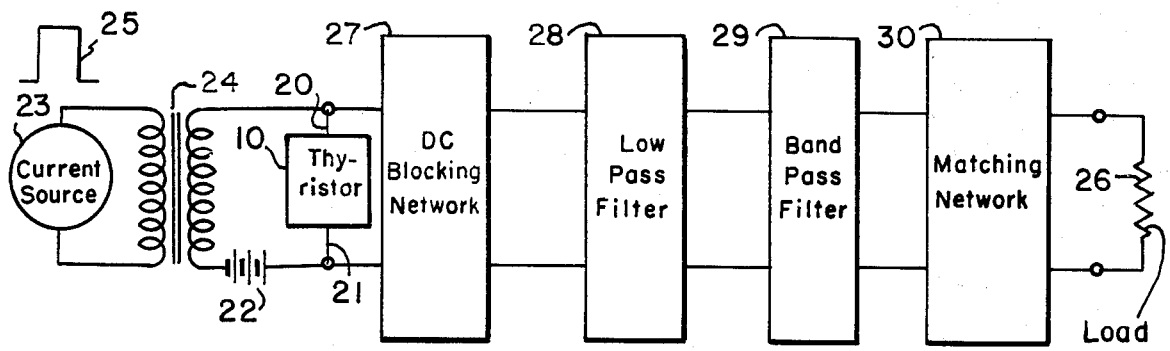
FIG. 2 is a schematic drawing showing a high speed, high power thyristor adapted in a circuit network.

Referring to the drawings, a thyristor is provided in a silicon semiconductor wafer or body 10 having opposed major surfaces 11 and 12 and having first, second, and third impurity regions 13, 14 and 15, respectively. The first and third regions 13 and 15 have high impurity concentrations (i.e., $1 \times 10^{17}$ to $1 \times 10^{21}$ atoms/cm$^3$) and are of opposite conductivity-type. SAid first and third regions 13 and 15 adjoin the surfaces 11 and 12, respectively, and correspond to anode-emitter and cathode-emitter regions, respectively.

Second region 14 positioned within body 10 between regions 13 and 15 has a relatively low impurity concentration, i.e., less than $5 \times 10^{14}$ atoms/cm$^3$, and corresponds to a base region. The conductivity-type of region 14 is the same impurity type as either region 13 or 15 and has a width of at least 80 and preferably greater than about 150 microns. Thus, the regions form at their transition either a P+N− junction at 16 or an N+P− junction at 17. The widths of first and third regions 13 and 15 are preferably small (e.g., less than about 50 microns) so that an abrupt (i.e., steep gradient) PN junction is formed at either 16 or 17, preferably by diffusion techniques, and the high impurity concentrations throughout regions 13 and 15 are maintained for low parasitic resistance and low stored charge. Also, the width and impurity concentration of region 14 is adjusted so that the ratio of reverse breakdown voltage of the PN junction to the punch-through voltage of the second impurity region 14 is between 1.4 and 3.3.

Affixed to surfaces 11 and 12 are electrical contacts 18 and 19, respectively, to make ohmic contact with first and third regions 13 and 15, respectively. Suitable metals for this purpose are molybdenum, aluminum, gold, silver, tantalum, and base alloys. Preferably, the contacts are affixed by vapor deposition of the metal.

Electrical leads 20 and 21 are then attached to contacts 18 and 19, respectively, and connected to a d.c. bias-power source 22 so that a reverse bias is established across body 10 greater than the punch-through voltage of region 14 but less than the reverse breakdown voltage of the PN junction at either 16 or 17.

Control-power source 23 is also connected through a transformer 24 to the body 10 via leads 20 and 21. Control-power source 23 is preferably in series with bias-power source 22. A high current, short duration square wave electrical signal in the form 25 can thereby be inputted to the body 10.

Load 26, e.g., a radar antenna, is also connected to the thyristor through leads 20 and 21. The load is connected in series (as shown) with the body 10 and power source 23 where a high voltage-high power output to the load is desired. On the other hand, the load may be connected in parallel with the body 10 and the power source 23 (not shown) where high current-high power output to the load is desired.

Also connected into the circuit between the body 10 and the load is DC blocking network 27, low pass filter 28, and band pass filter 29. DC blocking network 27 stops the passage of the dc bias from bias-power source 22 to the load 26. Low pass filter 28 blocks from the load 26 all ac signals with a frequency greater than the fundamental frequency ($f_1$) of the output from body 10; $f_1 = v_s/4\pi W_B$, where $v_s$ is the saturation velocity of carriers and $W_B$ is the width of second impurity region 14. Low pass filter 28 thus blocks the passage of the input to body 10 from the load 26. And band pass filter 29 eliminates the low frequency noise from reaching the load 26.

Also in the circuit between the body 10 and the load 26 is matching network 30 to provide for maximum power flow or transfer from the thyristor 10 to the load 26. Matching network 30 comprises components of inductance and capacitance to match the impedances of the thyristor and load at the frequency of interest which is usually the fundamental or lower harmonic frequencies of the thyristor. Preferably the matching network 30 is a high "Q" circuit tuned to the frequency of interest for optimum efficiency.

In operation, body 10 is biased by dc power source 22 to a voltage above the punch-through voltage of second impurity region 14, but below the reverse breakdown voltage of the PN junction. A low voltage, high power pulse is then applied from control-power source 23 causing a current having a density above the saturation current density to be inputted to body 10. The electric field thus produced propagates through second impurity region 14 at a much higher velocity than the velocity of the carriers (i.e., electrons and holes). A high density of ionized electron-holes pairs is hence left in the wake of the electric field as a "trapped plasma." In the presence of this plasma, the applied bias field collapses to a low value and the body 10 is in a low impedance, highly conductive mode generating a high current, short duration pulse which is transmitted to load 26 as either as high voltage or a high current-high power signal.

Subsequently, the electrons and holes will drift apart to their respective polarities under the influence of the applied bias from dc power source 22. As the plasma density diminishes, the electric field rises again to the external bias voltage so that the field at the PN junction resumes the high impedance blocking state.

Figure 3:
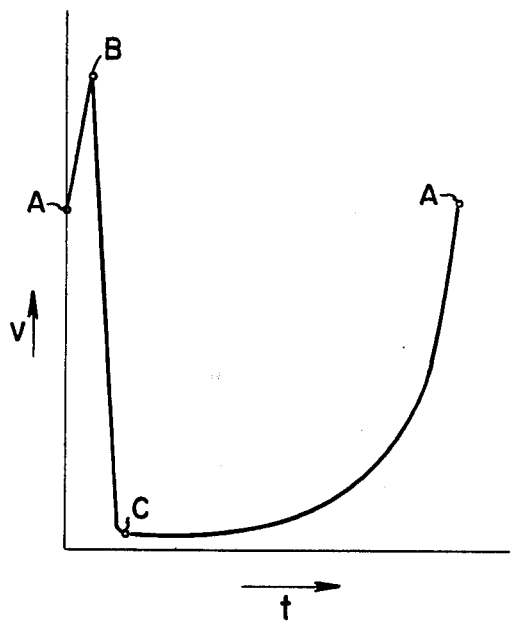
FIG. 3 is a graphic illustration of the voltage as a function of time of a thyristor in the circuit network of FIG. 2.

To illustrate the operational cycle reference is made to FIG. 3 showing the voltage output from body 10. At point A, the body responds as an equivalent capacitor and the response is equal to the dc bias voltage. When the square-wave input is provided from the control-power source 23, the voltage rises until it reaches the peak voltage at point B. The time required to reach point B is called the "turn-on time" and occurs in the present device in picoseconds. The plasma state is then reached and the electric field collapses; the voltage falls to point C which is about one four-hundredth of the value of point B. At this point, the body 10 outputs a high power pulse which is transmitted to the load as a high current pulse if the load is in series, or (as shown) as a high voltage pulse if the load is in parallel.

Thereafter, the plasma and residual excess carriers are extracted from the second impurity region, the carrier depletion region at the PN junction reestablished, and the thyristor recharged by the external bias. By these mechanisms, the voltage rebuilds to point A again. The time required to perform this part of the cycle is called the "turn-off time" and greatly exceeds the turn-on and plasma state times. This is of no consequence except in recycling because the power generation and/or switching occurs while the device is in the turn-on and plasma modes. In this connection it should be noted that the plasma formation and extraction occurs in a much shorter time than the recombination time of the electronhole pairs.

Thus the device is capable of very fast "turn-on times" for both voltage and current corresponding to the time to form the plasma. The rise time for voltage, given by $dv/dt = I/C$, is very fast because the capacitance of the reverse bias PN junction is very low. The rise time for current is very fast because the applied electric field by ac power source 23 far exceeds that required for avalanche breakdown.

It should be noted that the efficiency of the system is very high. Also, as a reverse biased PN junction in avalanche, it is capable of operating at junction temperatures greater than 200°C. and, for example, at junction operating temperatures of 300°C.

To further illustrate the invention, consider a silicon semiconductor body 10 of 250 microns in thickness having an impurity concentration epitaxially grown therein of between $1 \times 10^{13}$ and $1 \times 10^{14}$ atoms/cm$^3$. Diffused into the opposed major surfaces 11 and 12 are P+ impurity concentrations (e.g., $1 \times 10^{19}$ atoms/cm$^3$) and N+ impurity concentrations (e.g., $1 \times 10^{20}$ atoms/cm$^3$), respectively. Diffusions are to a depth of about 50 microns so that first impurity region 13 of 50 microns, second impurity region 14 of 150 microns, and third impurity region of 50 microns are formed in the silicon wafer 10.

The reverse breakdown voltage of the PN junction at 16 or 17 is 1500 volts, and the saturation current density of region 14 is 160 amps/cm$^2$. A dc bias power source 22 of 60 amps is applied across the body 10, and a square wave input from control power source 23 is 90 KVA. From these parameters, the rise time for voltage, given by $$\frac{dV}{dt} = \frac{I}{C}$$

is calculated to be $12 \times 10^4$ V/$\mu$ sec; and the current rise time, given by $$\frac{dI}{dt} = \frac{2I}{\tau} \frac{E_c^{(t)}}{E_c},$$

is calculated to be $12 \times 10^6$ A/$\mu$ sec. The voltage in the conducting state is found to be equal to or less than 15 volts.

While the presently preferred embodiments of the invention have been specifically described, it is distinctly understood that the invention may be otherwise variously embodied and used within the scope of the following claims.

What is claimed is:

1. A high speed, high power plasma thyristor circuit comprising:
   a. a silicon semiconductor body having opposed major surfaces and having first, second and third impurity regions therein; said first and third impurity regions each adjoining a major surface and having opposite conductivity-type; said second impurity region being within the body between said first and third impurity regions and having a width of at least 80 microns and an impurity concentration therethrough of less than about $5 \times 10^{14}$ atoms/cm$^3$; and a PN junction being in the body at a transition between said regions, and having a reverse breakdown voltage between about 1.4 and 3.3 times greater than the punch-through voltage of the second impurity region;
   b. electrical contacts affixed to the major surfaces to make ohmic contact with said first and third impurity regions;
   c. a bias power source electrically connected to the electrical contacts and capable of applying a reverse bias voltage across the body greater than the punch-through voltage of said second impurity region but less than the reverse breakdown voltage of the PN junction; and
   d. a control power source electrically connected to the electrical contacts and capable of causing a current pulse through the body having a density greater than the saturation current density of the second impurity region.

2. A high speed, high power plasma thyristor circuit as set forth in claim 1 wherein: the impurity concentration gradients at the transition from the first and third impurity regions to the second impurity region are steep.

3. A high speed, high power plasma thyristor circuit as set forth in claim 1 comprising in addition:
   e. a matching circuit for processing output signals from the body electrically connected to the electrical contacts and having high "Q" impedance for balancing impedances of the output signal from the body.

4. A high speed, high power plasma thyristor circuit as set forth in claim 1 wherein:
   said second impurity region has a width of at least 150 microns.

* * * * *